Oct. 4, 1960 J. E. LINDSAY 2,955,257
TRANSISTOR CLASS B SIGNAL AMPLIFIER CIRCUIT
Filed July 25, 1956
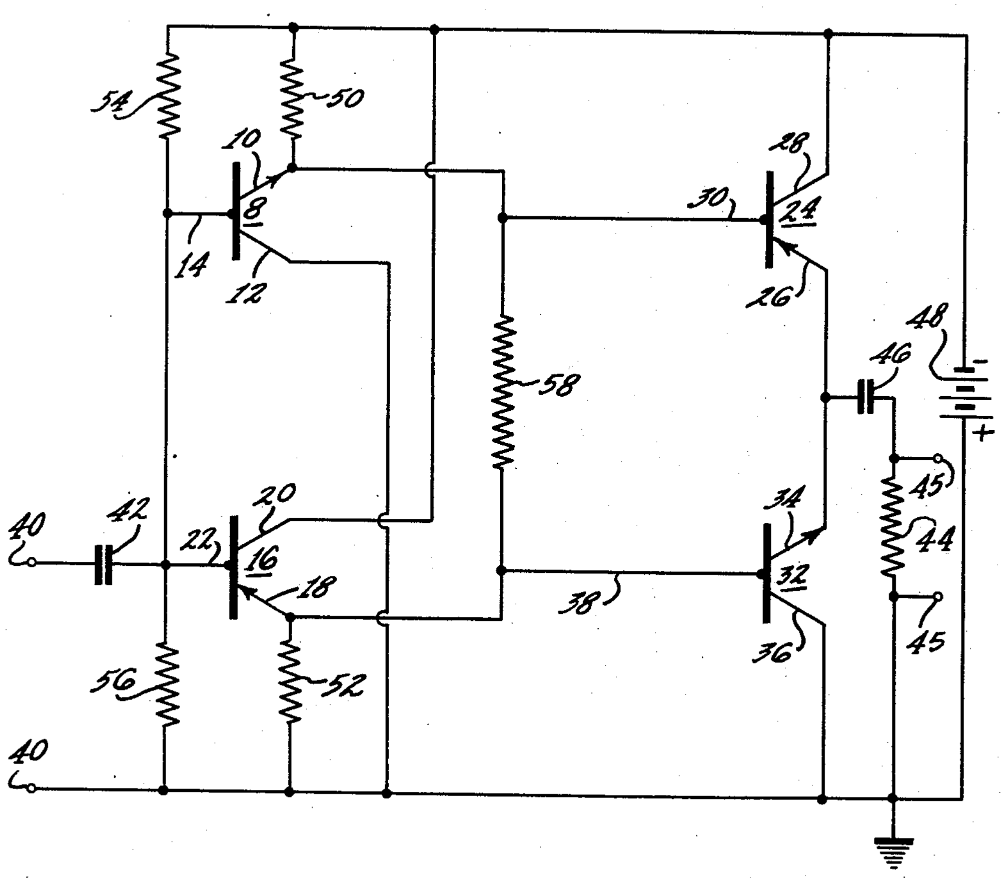
INVENTOR.
James E. Lindsay
BY H. L. Newton
ATTORNEY.

2,955,257
Patented Oct. 4, 1960

2,955,257

TRANSISTOR CLASS B SIGNAL AMPLIFIER CIRCUIT

James E. Lindsay, Moorestown, N.J., assignor to Radio Corporation of America, a corporation of Delaware Filed July 25, 1956, Ser. No. 600,030

2 Claims. (Cl. 330—13)

This invention relates in general to transistor signal amplifier circuits and in particular to stabilized transistor signal amplifier circuits of the class B type.

One of the problems incident to the design of signal amplifier circuits in which transistors are used as active signal amplifying elements is that the direct-current operating point of a transistor may tend to shift with variations in ambient temperature. The characteristics of transistors may also vary appreciably from one unit to another even though an effort is made to make them identical with each other. Accordingly, a circuit which has been adjusted to operate satisfactorily with one transistor may often be found to require readjustment for satisfactory operation with another transistor. Negative current feedback may be employed to stabilize the operating point of such circuits. This may be accomplished, for example, by connecting a resistor of predtermined resistance in series with the emitter electrode of the transistor, or by using external feedback networks. In the case of the former method the gain of the transistor stage is reduced since the emitter resistor is degenerative and, in the case of the latter method, extra circuit components and circuit connections are needed. Thus, neither of these methods is entirely satisfactory for use with a transistor class B power amplifier circuit.

It is, accordingly, an object of this invention to provide an improved transistor class B signal amplified circuit which is stable and reliable in operation.

It is another object of the present invention to provide improved and simplified means for stabilizing the circuit operation of a class B transistor signal amplifier circuit with variations in temperature, the interchanging of transistors in the circuit, and the like.

Stabilization of the operating point of a transistor class B circuit is accomplished, in accordance with the invention, in a circuit wherein a class B output stage employing a pair of transistors of opposite conductivity types is driven by a class B driver stage which also employs a pair of opposite conductivity type transistors. The direct-current voltages of the driver transistors are fixed by means of a low resistance voltage divider to stabilize the circuit operation of the driver transistors. The voltage on the emitter electrodes of the driver transistors are applied to the corresponding base electrode of the output transistors to stabilize the operating point of the output transistors. Specifically, the driver and output transistors are operated in the common collector configuration and the emitter electrode of each of the driver transistors is direct-current conductively connected to the base electrode of both output transistors to achieve the desired stabilization.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the single figure is a schematic circuit diagram of a transistor signal amplifier circuit embodying the invention.

Referring now to the drawing, a two stage class B signal amplifier circuit includes a driver stage comprising a pair of opposite conductivity type transistors 8 and 16 and an output stage which also includes a pair of opposite conductivity type transistors 24 and 32. The transistors 8 and 32 may be considered to be junction transistors of the N–P–N type while the transistors 16 and 24 are of the P–N–P junction type. Other type transistors may be used, however, and their conductivity type may be reversed if the polarity of the biasing supply source is also reversed. The transistors 8 and 32 may be of N type conductivity and the transistors 16 and 24 may be of P type conductivity, for example. Input signals are applied to the circuit at a pair of input terminals 40, one of which is grounded and the other of which is connected through a coupling capacitor 42 to the base electrodes 22 and 14 of the driver transistors 16 and 8, respectively. Output signals may be derived at output terminals 45 from across a load impedance element, illustrated as a resistor 44, which is connected at one end through a coupling capacitor 46 to the emitters 26 and 34 of the output transistors 24 and 32, respectively, and at the other end to ground. The emiter electrodes 26 and 34 of the output transistors are connected directly together. To supply biasing voltages for the transistors, a direct-current supply source, which is illustrated as a battery 48, has its positive terminal grounded and its negative treminal connected to the collector electrodes 28 and 20 of the output transistor 24 and the driver transistor 16, respectively, and through a stabilizing resistor 50 to the emitter 10 of the driver transistor 8. The emitter 18 of the other driver transistor 16 is connected to ground through a stabilizing resistor 52. The resistors 50 and 52 stabilize the emitter current of the driver transistors 8 and 16. The collector electrodes 12 and 36 of the driver transistor 8 and the output transistor 32, respectively, are connected directly to ground as shown.

The direct-current operating voltages of the driver transistors 8 and 16 are fixed by connecting their respective base electrodes 14 and 22 through resistors 54 and 56, which comprise a low resistance voltage divider, to the negative terminal of the biasing battery 48 and ground, respectively. The resistance values of the resistors 54 and 56 and of the emitter stabilizing resistors 50 and 52 are chosen to provide a small amount of forward bias for the driver transistors 8 and 16, which are biased for class B operation. The voltage divider resistors 54 and 56 and the emitter stabilizing resistors 50 and 52 thus minimize cross-over distortion and stabilize the direct-current operating point of the driver transistors 8 and 16.

The output transistors 24 and 32 and the driver transistors 8 and 16 are operated in the common collector configuration, the emitter electrodes of each of these transistors serving as an output electrode. Thus the emitter electrode 10 of the first driver transistor 8 is connected through a resistor 58 to the base electrode 38 of the output transistor 32 and, in accordance with the invention, directly to the base electrode 30 of the output transistor 24. Similarly, the emitter electrode 18 of the second driver transistor 16 is connected through the resistor 58 to the base 30 of the output transistor 24 and directly to the base electrode 38 of the other output transistor 32. By direct-current conductively connecting the emitter electrodes of each of the driver transistors to the base electrodes of both output transistors, proper driving signals for class B operation of the output transistors is provided and the direct-current operating point of the output transistors is stabilized. The resistance of the resistor 58 will normally be very low. The resistor 58 may have a negative temperature coefficient to provide further temperature stabilization of the circuit, thermistors being an example of this type of resistance, or may be a non-linear resistance device such as a diode if desired.

In operation, input signals are simultaneously applied through the input terminals 40 to the base electrodes 14 and 22 of the driver transistors 8 and 16, respectively. On positive half cycles of the applied input signal, the N-P-N driver transistor 8 will be conductive and the current flow out of the emitter electrode 10 of this transistor will increase. Since the base 38 of the output transistor 32 is connected to the emitter 10 of the driver transistor 8, the N-P-N output transistor 32 will conduct to provide amplified signal current flow through the load resistor 44. During the positive portions of the applied input signal, the transistors 16 and 24 will remain nonconductive. When negative half cycles of signals are applied to the input terminals 40, however, the P-N-P driver transistor 16 will be rendered conductive. Current flow into the emitter 18 of the driver transistor 16 will thus increase. Accordingly, the P-N-P output transistor 24 will conduct to provide amplified signal current flow through the load resistor 44. The direct-current voltage on the emitter electrodes 10 and 18 of the driver transistors 8 and 16, respectively, are applied to the base electrodes 30 and 38 of the output transistors.

While it will be understood that the circuit specifications may vary according to the design for any particular application, the following circuit specifications are included by way of example only:

| | |
|---|---|
| Resistors 50 and 52 | 3,900 ohms each. |
| Resistors 54 and 56 | 4,700 ohms each. |
| Resistor 58 | 180 ohms. |
| Battery 48 | 20 volts. |

As explained, hereinbefore, the operating point of the driver transistors are stabilized by the low resistance voltage divider and the emitter stabilizing resistors. Accordingly, the emitter voltage of the driver transistors are stabilized. Since these voltages are applied to the base electrodes of the output transistors, whose emitter electrodes are connected directly together, the emitter current and thus the operating points of the output transistors will be stabilized. Accordingly, stable and efficient class B power amplification is provided with a circuit embodying a minimum number of circuit components and relatively simple circuit connections.

What is claimed is:

1. A signal amplifier circuit comprising, in combination, a driver stage including a first transistor of one conductivity type having a base, an emitter, and a collector electrode, and a second transistor of an opposite conductivity type having a base, an emitter, and a collector electrode; means providing a signal input circuit connected with the base electrodes of said transistors for simultaneously applying input signals thereto; means providing a direct-current supply source; low impedance voltage divider means connecting the base electrodes of said first and second transistors with said supply source and for stabilizing the operating point of said first and second transistors; stabilizing impedance means connecting the emitter electrodes of said first and second transistors with said supply source; an output stage including a third transistor of said opposite conductivity type having a base, an emitter, and a collector electrode, and a fourth transistor of said one conductivity type having a base, an emitter, and a collector electrode; means connecting the collector electrodes of said third and fourth transistors with said supply source; means providing a signal output circuit connected with the emitter electrodes of said third and fourth transistors for deriving a push-pull output signal therefrom; first direct-current conductive means connecting the emitter electrode of said first transistor with the base electrode of said third transistor to apply the direct emitter voltage of said first transistor to the base electrode of said third transistor; second direct-current conductive means connecting the emitter electrode of said second transistor with the base electrode of said fourth transistor to apply the direct emitter voltage of said second transistor to the base electrode of said fourth transistor; and low resistance impedance means connecting the base electrode of said third transistor with the base electrode of said fourth transistor; said first and second direct-current conductive means and said impedance means providing signal translation from the emitter electrode of said first transistor to the base of said fourth transistor and from the emitter electrode of said second transistor to the base of said third transistor to apply signals in push-pull to the base electrodes of said third and fourth transistors.

2. A signal amplifier circuit as defined in claim 1 wherein said low resistance impedance means is temperature sensitive.

References Cited in the file of this patent

UNITED STATES PATENTS

| | | |
|---|---|---|
| 2,666,818 | Shockley | Jan. 19, 1954 |
| 2,789,164 | Stanley | Apr. 16, 1957 |
| 2,847,519 | Aronson | Aug. 12, 1958 |

OTHER REFERENCES

Shea: "Principles of Transistor Circuits," Sept. 15, 1953, page 156.

Lo et al.: "Transistor Electronics," Sept. 26, 1955, page 218.